(12) United States Patent
Hu (10) Patent No.: US 11,522,153 B2
(45) Date of Patent: Dec. 6, 2022

(54) ORGANIC LIGHT-EMITTING DIODE DISPLAY DEVICE WITH BONDING TERMINAL ON NON-LIGHT-EMITTING SURFACE AND METHOD FOR MANUFACTURING OLED DISPLAY DEVICE WITH BONDING TERMINAL ON NON-LIGHT-EMITTING SURFACE

(71) Applicant: Wuhan China Star Optoelectronics Semiconductor Display Technology Co., Ltd., Wuhan (CN)

(72) Inventor: Niu Hu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 288 days.

(21) Appl. No.: 16/606,995

(22) PCT Filed: Feb. 22, 2019

(86) PCT No.: PCT/CN2019/075965
§ 371 (c)(1),
(2) Date: Oct. 21, 2019

(87) PCT Pub. No.: WO2020/103349
PCT Pub. Date: May 28, 2020

(65) Prior Publication Data
US 2021/0336194 A1    Oct. 28, 2021

(30) Foreign Application Priority Data
Nov. 21, 2018 (CN) .......................... 201811393824.4

(51) Int. Cl.
*H01L 51/52* (2006.01)
*G09G 3/3225* (2016.01)
(Continued)

(52) U.S. Cl.
CPC ....... *H01L 51/5237* (2013.01); *G09G 3/3225* (2013.01); *H01L 51/0097* (2013.01); *H01L 51/56* (2013.01); *H01L 2251/5315* (2013.01)

(58) Field of Classification Search
CPC . H01L 51/5237; H01L 51/56; H01L 51/0097; H01L 2251/5315
(Continued)

(56) References Cited

U.S. PATENT DOCUMENTS

2018/0061638 A1*  3/2018  Yamazaki ........... H01L 31/1896

* cited by examiner

*Primary Examiner* — Xia L Cross (57) ABSTRACT

An OLED display device and a method for manufacturing the same are provided. The OLED display device includes an OLED display panel, a driving module and a bonding terminal. The OLED display panel includes a light-emitting surface and a non-light-emitting surface opposite to the light-emitting surface, the bonding terminal is disposed on the non-light-emitting surface, and the driving module is bonded to the bonding terminal. Since the bonding terminal is disposed on the non-light-emitting surface of the OLED display panel and the driving module is bonded to the bonding terminal on the non-light-emitting surface, compared with the prior art, the bonded driving module does not need to be bent again because the bonding terminal is disposed on the non-light-emitting surface of the OLED display panel. The reduction of the bezel width can be maximized and the screen ratio can be increased while reducing the risk of a broken wire.

2 Claims, 5 Drawing Sheets

(51) Int. Cl.
*H01L 51/00* (2006.01)
*H01L 51/56* (2006.01)
(58) Field of Classification Search
USPC .......................................................... 257/40
See application file for complete search history.

ORGANIC LIGHT-EMITTING DIODE DISPLAY DEVICE WITH BONDING TERMINAL ON NON-LIGHT-EMITTING SURFACE AND METHOD FOR MANUFACTURING OLED DISPLAY DEVICE WITH BONDING TERMINAL ON NON-LIGHT-EMITTING SURFACE

FIELD OF INVENTION

The present invention generally relates to the display technology and, more particularly, to an organic light-emitting diode (OLED) display device and a method for manufacturing the OLED display device.

BACKGROUND OF INVENTION

With the development of the display technology, flat panel display (FPD) devices are widely used in various consumer electronic products such as mobile phones, televisions, personal digital assistants, digital cameras, notebook computers, desktop computers, etc., due to their advantages including high image quality, power saving, thin body and wide application range, and have become the mainstream in display devices.

Organic light-emitting diode (OLED) display devices have been considered as an emerging application technology for next-generation flat panel displays because they are self-illuminating, do not require a backlight, and have excellent features such as high contrast, thin thickness, wide viewing angle, fast response, applicability to flexible panels, wide temperature range, simple structure and process and so on.

An OLED display device generally includes a substrate, an anode disposed on the substrate, a hole-injection layer disposed on the anode, a hole-transport layer disposed on the hole-injection layer, a light-emitting layer disposed on the hole-transport layer, an electron-transport layer disposed on the light-emitting layer, an electron-injection layer disposed on the electron-transport layer, and a cathode disposed on the electron-injection layer. The principle of luminescence of an OLED display device is that carriers are driven by the electric field to inject and recombine in the semiconductor materials and the organic luminescent materials to cause luminescence. Specifically, an OLED display device generally uses an ITO pixel electrode and a metal electrode as the anode and the cathode of the device, respectively. Under a certain driving voltage, electrons and holes are respectively injected from the cathode and the anode to the electron-transport layer and the hole-transport layer. Electrons and holes migrate and meet in the light-emitting layer through the electron-transport layer and the hole-transport layer, respectively, to form excitons to excite the light-emitting molecules and emit visible light through radiation relaxation.

With the development of the display technology and the increase of people's requirements for products, the screen ratio of an OLED display device is constantly improved while high resolution is pursued. The narrow bezel technology has also been rapidly developed. On the bonding side, the original direct chip-on film (COF) bonding has been gradually developed into a bending bonding structure. Specifically, the bonding terminal is formed on the substrate such that the flexible circuit board is bent to the back surface of the substrate after being bonded to the bonding terminal to increase the screen ratio. In practical applications, as the bending radius of the flexible circuit board becomes smaller, the bezel of the display panel is narrower. However, due to the limitation of the trace structure, the bending radius needs to be kept within a certain range in practical applications, and cannot be infinitely small. In other words, the bending radius always occupies a certain portion of the bezel width because a broken wire is easily caused when bending.

SUMMARY OF INVENTION

One object of the present invention is to provide an OLED display device capable of maximizing the reduction of the bezel width without the need for bending and increasing the screen ratio while reducing the risk of a broken wire.

Another object of the present invention is to provide a method for manufacturing an OLED display device capable of maximizing the reduction of the bezel width without the need for bending and increasing the screen ratio while reducing the risk of a broken wire.

To achieve the foregoing objects, the present invention provides an organic light-emitting diode (OLED) display device, including an OLED display panel, a driving module and a bonding terminal, wherein the OLED display panel includes a light-emitting surface and a non-light-emitting surface opposite to the light-emitting surface, the bonding terminal is disposed on the non-light-emitting surface, and the driving module is bonded to the bonding terminal.

In one embodiment, the OLED display panel includes a flexible substrate, a driving circuit layer disposed on the flexible substrate, an OLED layer disposed on the driving circuit layer, and a thin-film encapsulation layer disposed on the OLED layer.

In one embodiment, the OLED display panel is a bottom-emitting OLED display panel, the light-emitting surface thereof is a side surface of the flexible substrate away from the thin-film encapsulation layer, the non-light-emitting surface is a side surface of the thin-film encapsulation layer away from the flexible substrate, and the bonding terminal is electrically connected to the driving circuit layer through a first via hole penetrating the thin-film encapsulation layer and the OLED layer.

In one embodiment, the OLED display panel is a top-emitting OLED display panel, the light-emitting surface thereof is a side surface of the thin-film encapsulation layer away from the flexible substrate, non—the light-emitting surface is a side surface of the flexible substrate away from the thin-film encapsulation layer, and the bonding terminal is electrically connected to the driving circuit layer through a second via hole penetrating the flexible substrate.

In one embodiment, an edge of the non-light-emitting surface of the OLED display panel is provided with a recess, in which the bonding terminal is disposed.

The present invention further provides a method for manufacturing an OLED display device, including the steps of:

Step S1, manufacturing an OLED display panel including a light-emitting surface and a non-light-emitting surface opposite to the light-emitting surface;

Step S2, forming a bonding terminal on the non-light-emitting surface; and

Step S3, providing a driving module, and bonding the driving module to the bonding terminal.

In one embodiment, Step S1 further includes:

providing a rigid substrate, on which a flexible substrate is formed;

forming a driving circuit layer on the flexible substrate;

forming an OLED layer on the driving circuit layer; and forming a thin-film encapsulation layer on the OLED layer.

In one embodiment, the OLED display panel manufactured in Step S1 is a bottom-emitting OLED display panel, the light-emitting surface thereof is a side surface of the flexible substrate away from the thin-film encapsulation layer, and the non-light-emitting surface is a side surface of the thin-film encapsulation layer away from the flexible substrate; and Step S2 further includes:

forming the bonding terminal on the side surface of the thin-film encapsulation layer away from the flexible substrate, wherein the bonding terminal is electrically connected to the driving circuit layer through a first via hole penetrating the thin-film encapsulation layer and the OLED layer; and lifting off the flexible substrate from the rigid substrate.

In one embodiment, the OLED display panel manufactured in Step S1 is a top-emitting OLED display panel, the light-emitting surface thereof is a side surface of the thin-film encapsulation layer away from the flexible substrate, and the non—the light-emitting surface is a side surface of the flexible substrate away from the thin-film encapsulation layer; and Step S2 further includes:

lifting off the flexible substrate from the rigid substrate; and forming the bonding terminal on the side surface of the flexible substrate away from the thin-film encapsulation layer, wherein the bonding terminal is electrically connected to the driving circuit layer through a second via hole penetrating the flexible substrate.

In one embodiment, Step S2 further includes: providing an edge of the non-light-emitting surface of the OLED display panel with a recess, in which the bonding terminal is formed.

Beneficial effects of the present invention—the OLED display device according to the present invention includes an OLED display panel, a driving module and a bonding terminal. The OLED display panel includes a light-emitting surface and a non-light-emitting surface opposite to the light-emitting surface, the bonding terminal is disposed on the non-light-emitting surface, and the driving module is bonded to the bonding terminal. Since the bonding terminal is disposed on the non-light-emitting surface of the OLED display panel and the driving module is bonded to the bonding terminal on the non-light-emitting surface, compared with the prior art, the bonded driving module does not need to be bent again because the bonding terminal is disposed on the non-light-emitting surface of the OLED display panel. Accordingly, the reduction of the bezel width can be maximized and the screen ratio can be increased while reducing the risk of a broken wire. The present invention further provides a method for manufacturing an OLED display device capable of maximizing the reduction of the bezel width without the need for bending and increasing the screen ratio while reducing the risk of a broken wire.

DESCRIPTION OF DRAWINGS

For a better understanding of the features and technical aspects of the present invention, please refer to the following detailed description and accompanying drawings of the present invention. However, the accompanying drawings are only for reference and description, and are not intended to limit the present invention. Among the accompanying drawings.

DETAILED DESCRIPTION OF PREFERRED EMBODIMENTS

In order to further clarify the technical means adopted by the present invention and its effects, the following is a detailed description in conjunction with preferred embodiments of the present invention and the accompanying drawings.

Figure 1:
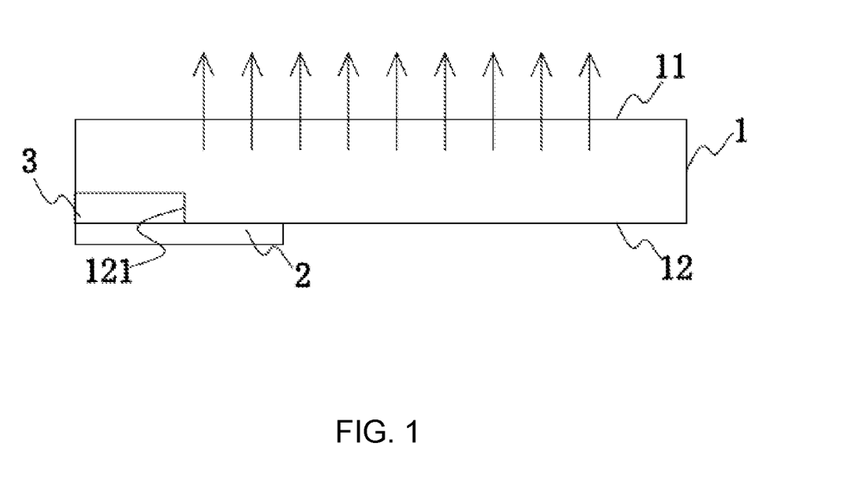
FIG. 1 is a schematic view of an OLED display device according to the present invention.
Figure 2:
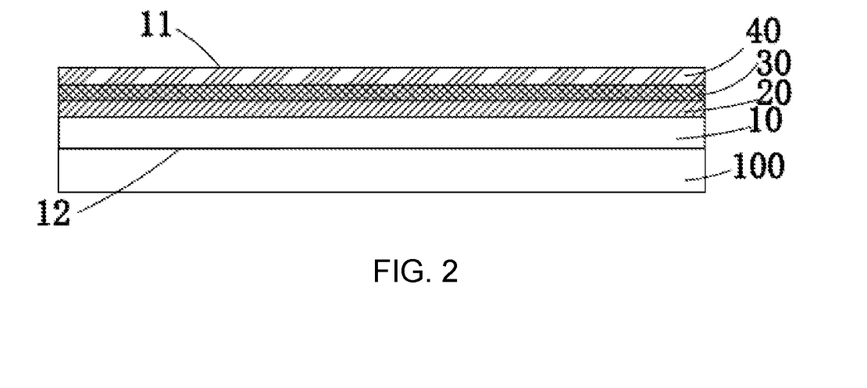
FIG. 2 to FIG. 3 are schematic diagrams showing Step S1 and Step S2 in a method for manufacturing an OLED display device according to a first embodiment of the present invention.
Figure 3:
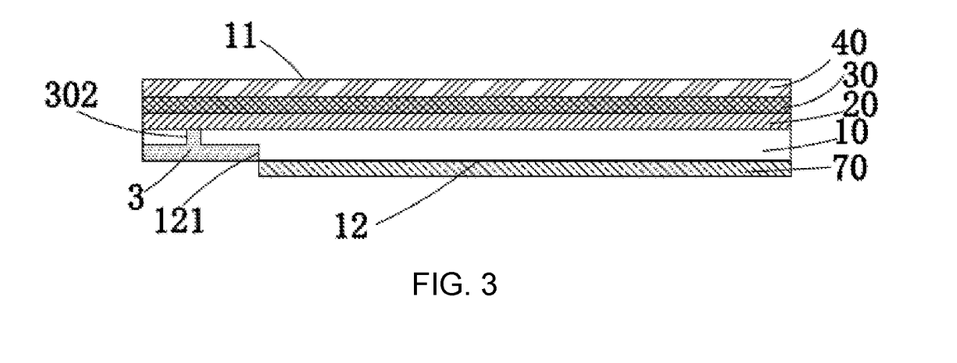

Referring to FIG. 1 to FIG. 3, the present invention provides an OLED display device, including an OLED display panel 1, a driving module 2 and a bonding terminal 3.

The OLED display panel 1 includes a light-emitting surface 11 and a non-light-emitting surface 12 opposite to the light-emitting surface 11, the bonding terminal 3 is disposed on the non-light-emitting surface 12, and the driving module 2 is bonded to the bonding terminal 3.

Figure 4:
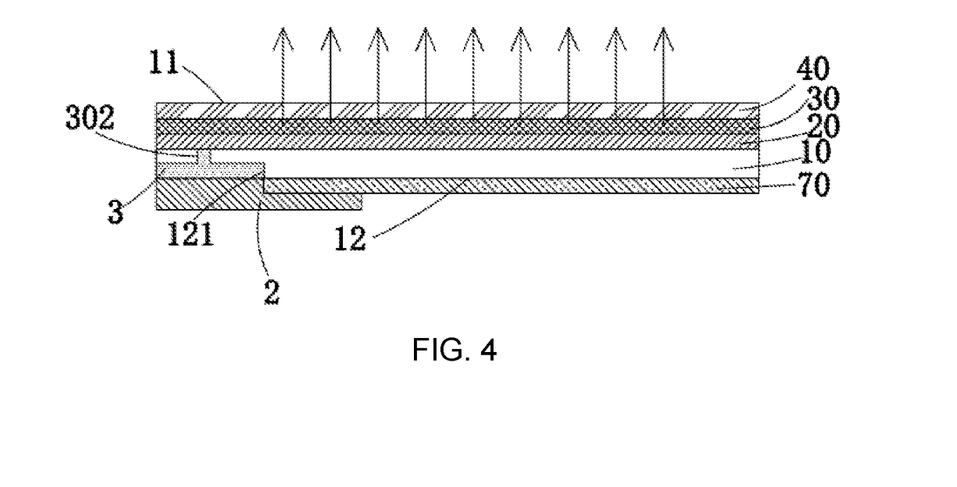
FIG. 4 is a schematic diagram showing Step S3 in a method for manufacturing an OLED display device according to a first embodiment of the present invention.
Figure 8:
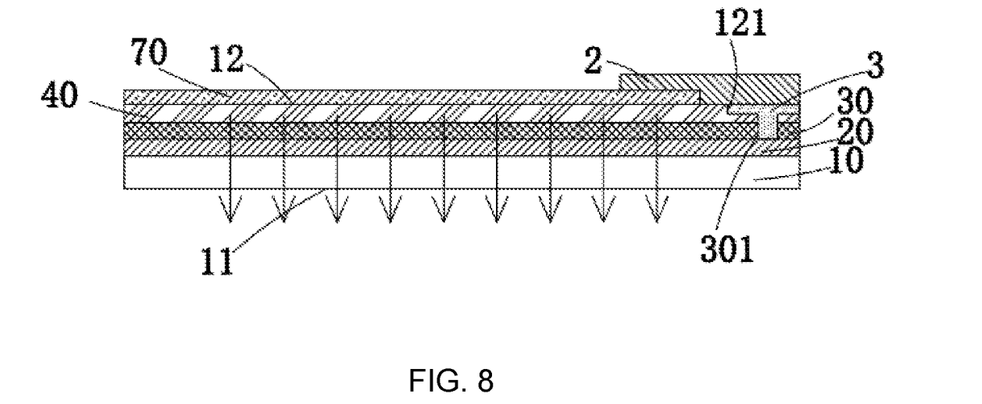
FIG. 8 is a schematic diagram showing Step S3 in a method for manufacturing an OLED display device according to a second embodiment of the present invention.

Specifically, as shown in FIG. 4 or FIG. 8, the OLED display panel 1 includes a flexible substrate 10, a driving circuit layer 20 disposed on the flexible substrate 10, an OLED layer 30 disposed on the driving circuit layer 20, and a thin-film encapsulation layer 40 disposed on the OLED layer 30.

Furthermore, the driving circuit layer 20 includes a plurality of thin-film transistors (TFTs), a plurality of scan lines, and a plurality of data lines. The OLED layer 30 includes a plurality of OLEDs. The plurality of TFTs is arranged as an array. The gates of TFTs on each row are electrically connected to a scan line, the sources of TFTs on each column are electrically connected to a data line, and the drain of each TFT is electrically connected to an OLED.

Specifically, each OLED includes a bottom electrode disposed on the driving circuit layer 20, a light-emitting layer disposed on the bottom electrode, and a top electrode disposed on the light-emitting layer.

OLEDs can be classified into top-emitting OLEDs and bottom-emitting OLEDs according to different light transmission characteristics between the bottom electrode and the top electrode, and thus the corresponding OLED display panels include top-emitting OLED display panels and bottom-emitting OLED display panels. The top electrode of a top-emitting OLED is a transparent electrode, and the bottom electrode is a reflective electrode, such that the light emitted by the light-emitting layer is directly emitted from the top electrode or reflected from the bottom electrode and then emitted from the top electrode. The top electrode of a bottom-emitting OLED is a reflective electrode, and the bottom electrode is a transparent electrodes, such that the light emitted from the light-emitting layer is directly emitted from the bottom electrode or reflected from the top electrode and then emitted from the bottom electrode.

Specifically, as shown in FIG. 4, in a first embodiment of the present invention, the OLED display panel 1 is a top-emitting OLED display panel. The light-emitting surface 11 thereof is a side surface of the thin-film encapsulation layer 40 away from the flexible substrate 10, and the non-light-emitting surface 12 is a side surface of the flexible substrate 10 away from the thin-film encapsulation layer 40. The bonding terminal 3 is electrically connected to the driving circuit layer 20 through a second via hole 302 penetrating the flexible substrate 10.

Furthermore, in a first embodiment of the present invention, the flexible substrate 10 is transparent, and may be selected from a group consisting of polyimide (PI), polyetherimide (PEI), polyphenylene sulfide (PPS), polyarylates (PAR), and any combination thereof.

Specifically, as shown in FIG. 8, in a second embodiment of the present invention, the OLED display panel 1 is a bottom-emitting OLED display panel. The light-emitting surface 11 thereof is a side surface of the flexible substrate 10 away from the thin-film encapsulation layer 40, and the non-light-emitting surface 12 is a side surface of the thin-film encapsulation layer 40 away from the flexible substrate 10. The bonding terminal 3 is electrically connected to the driving circuit layer 20 through a first via hole 301 penetrating the thin-film encapsulation layer 40 and the OLED layer 30.

Furthermore, in a second embodiment of the present invention, the flexible substrate 10 is non-transparent and may be selected from a group consisting of polyimide (PI), polyetherimide (PEI), polyphenylene sulfide (PPS), polyarylates (PAR), and any combination thereof.

Specifically, in the OLED display device of the present invention, the non-light-emitting surface 12 is further provided with a protective film 70. In the first embodiment, a protective layer 70 is provided on one side of the thin-film encapsulation layer 40 away from the flexible substrate 10. In the second embodiment, a protective layer 70 is provided on one side of the flexible substrate 10 away from the thin-film encapsulation layer 40.

Preferably, an edge of the non-light-emitting surface 12 of the OLED display panel 1 is provided with a recess 121, in which the bonding terminal 3 is disposed, such that the bonding terminal 3, after being formed, does not protrude from the surface of the non-light-emitting surface 12 to maintain the flatness of the non-light-emitting surface 12 and avoid increasing the thickness of the product. In the first embodiment, a recess 121 is provided on one side of the thin-film encapsulation layer 40 away from the flexible substrate 10. The depth of the recess 121 is smaller than the thickness of the film encapsulation layer 40. In the second embodiment, a recess 121 is provided on one side of the flexible substrate 10 away from the thin-film encapsulation layer 40. The depth of the recess 121 is smaller than the thickness of the flexible substrate 10.

Furthermore, the protective layer 70 does not cover the recess 121 such that the bonding terminal 3 is exposed to bond the driving module 2.

Specifically, the driving module 2 is a chip-on film (COF) or a flexible printed circuit (FPC).

Therefore, by providing the bonding terminal on the non-light-emitting surface of the OLED display panel, the driving module can be bonded to the bonding terminal. Compared with the prior art, the bonded driving module does not need to be bent again because the bonding terminal is disposed on the non-light-emitting surface of the OLED display panel. Accordingly, the reduction of the bezel width can be maximized and the screen ratio can be increased while reducing the risk of a broken wire.

Figure 9:
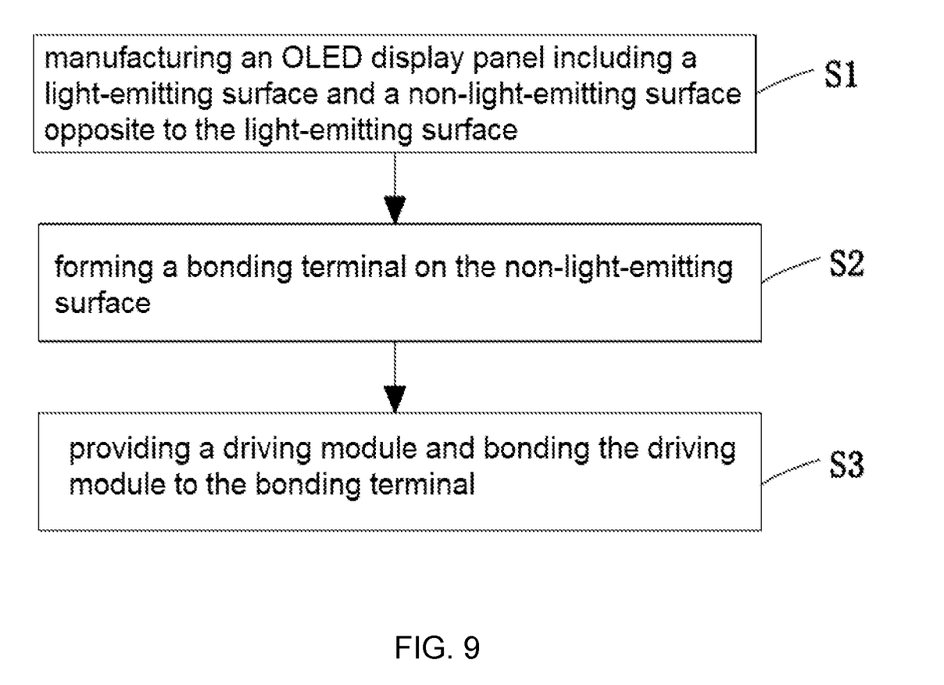
FIG. 9 is a flowchart of a method for manufacturing an OLED display device according to the present invention.

Referring to FIG. 9, the present invention provides a method for manufacturing an OLED display device, and the method includes the following steps:

In Step S1, an OLED display panel 1 is manufactured. The OLED display panel 1 includes a light-emitting surface 11 and a non-light-emitting surface 12 opposite to the light-emitting surface 11.

Figure 5:
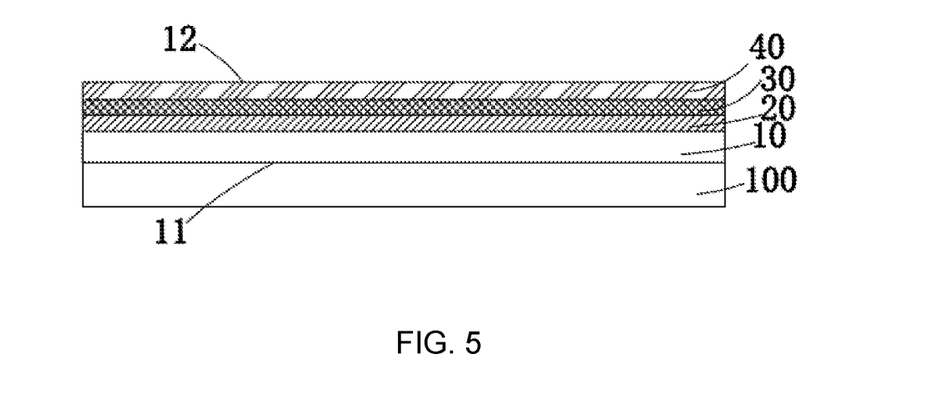
FIG. 5 to FIG. 7 are schematic diagrams showing Step S1 and Step S2 in a method for manufacturing an OLED display device according to a second embodiment of the present invention.

Specifically, as shown in FIG. 2 or FIG. 5, Step S1 includes:

providing a rigid substrate 100, on which a flexible substrate 10 is formed;

forming a driving circuit layer 20 on the flexible substrate 10;

forming an OLED layer 30 on the driving circuit layer 20; and forming a thin-film encapsulation layer 40 on the OLED layer 30.

Furthermore, the driving circuit layer 20 includes a plurality of thin-film transistors (TFTs), a plurality of scan lines, and a plurality of data lines. The OLED layer 30 includes a plurality of OLEDs. The plurality of TFTs is arranged as an array. The gates of TFTs on each row are electrically connected to a scan line, the sources of TFTs on each column are electrically connected to a data line, and the drain of each TFT is electrically connected to an OLED.

Specifically, each OLED includes a bottom electrode disposed on the driving circuit layer 20, a light-emitting layer disposed on the bottom electrode, and a top electrode disposed on the light-emitting layer.

OLEDs can be classified into top-emitting OLEDs and bottom-emitting OLEDs according to different light transmission characteristics between the bottom electrode and the top electrode, and thus the corresponding OLED display panels include top-emitting OLED display panels and bottom-emitting OLED display panels. The top electrode of a top-emitting OLED is a transparent electrode, and the bottom electrode is a reflective electrode, such that the light emitted by the light-emitting layer is directly emitted from the top electrode or reflected from the bottom electrode and then emitted from the top electrode. The top electrode of a bottom-emitting OLED is a reflective electrode, and the bottom electrode is a transparent electrodes, such that the light emitted from the light-emitting layer is directly emitted from the bottom electrode or reflected from the top electrode and then emitted from the bottom electrode.

Specifically, as shown in FIG. 2, in a first embodiment of the present invention, the OLED display panel 1 is a top-emitting OLED display panel. The light-emitting surface 11 thereof is a side surface of the thin-film encapsulation layer 40 away from the flexible substrate 10, and the non-light-emitting surface 12 is a side surface of the flexible substrate 10 away from the thin-film encapsulation layer 40.

Furthermore, in a first embodiment of the present invention, the flexible substrate 10 is transparent, and may be selected from a group consisting of polyimide (PI), polyetherimide (PEI), polyphenylene sulfide (PPS), polyarylates (PAR), and any combination thereof.

Specifically, as shown in FIG. 5, in a second embodiment of the present invention, the OLED display panel 1 is a bottom-emitting OLED display panel. The light-emitting surface 11 thereof is a side surface of the flexible substrate 10 away from the thin-film encapsulation layer 40, and the non-light-emitting surface 12 is a side surface of the thin-film encapsulation layer 40 away from the flexible substrate 10.

Furthermore, in a second embodiment of the present invention, the flexible substrate 10 is non-transparent and may be selected from a group consisting of polyimide (PI), polyetherimide (PEI), polyphenylene sulfide (PPS), polyarylates (PAR), and any combination thereof.

In Step S2, a bonding terminal 3 is formed on the non-light-emitting surface 12.

Specifically, as shown in FIG. 2 to FIG. 3, in the first embodiment of the present invention, Step S2 includes:

lifting off the flexible substrate 10 from the rigid substrate 100; and forming the bonding terminal 3 on the side surface of the flexible substrate 10 away from the thin-film encapsulation layer 40, wherein the bonding terminal 3 is electrically connected to the driving circuit layer 20 through a second via hole 302 penetrating the flexible substrate 10.

Specifically, the flexible substrate 10 is lifted off from the rigid substrate 100 by a laser lift-off (LLO) process.

Figure 6:
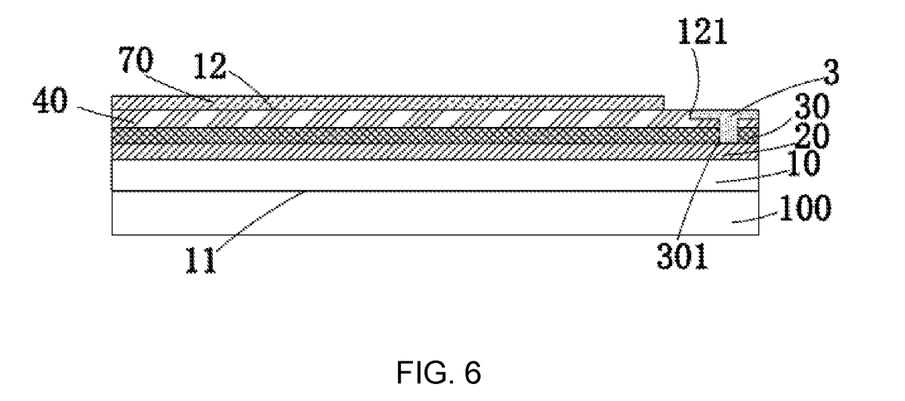
Figure 7:
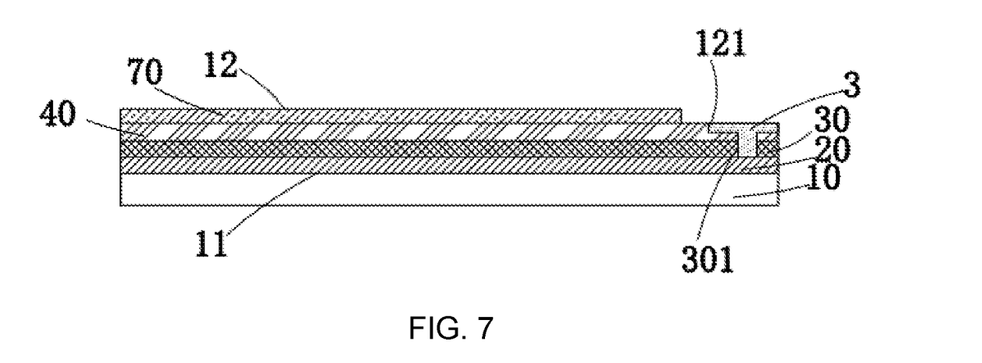

Specifically, as shown in FIG. 5 to FIG. 7, in the second embodiment of the present invention, Step S2 includes:

forming the bonding terminal 3 on the side surface of the thin-film encapsulation layer 40 away from the flexible substrate 10, wherein the bonding terminal 3 is electrically connected to the driving circuit layer 20 through a first via hole 301 penetrating the thin-film encapsulation layer 40 and the OLED layer 30; and lifting off the flexible substrate 10 from the rigid substrate 100.

Specifically, the flexible substrate 10 is lifted off from the rigid substrate 100 by a laser lift-off (LLO) process.

Specifically, Step S2 further includes forming a protective film 70 on the non-light-emitting surface 12. In the first embodiment, a protective layer 70 is provided on one side of the thin-film encapsulation layer 40 away from the flexible substrate 10. In the second embodiment, a protective layer 70 is provided on one side of the flexible substrate 10 away from the thin-film encapsulation layer 40.

Preferably, an edge of the non-light-emitting surface 12 of the OLED display panel 1 is provided with a recess 121, in which the bonding terminal 3 is disposed, such that the bonding terminal 3, after being formed, does not protrude from the surface of the non-light-emitting surface 12 to maintain the flatness of the non-light-emitting surface 12 and avoid increasing the thickness of the product. In the first embodiment, a recess 121 is provided on one side of the thin-film encapsulation layer 40 away from the flexible substrate 10. The depth of the recess 121 is smaller than the thickness of the film encapsulation layer 40. In the second embodiment, a recess 121 is provided on one side of the flexible substrate 10 away from the thin-film encapsulation layer 40. The depth of the recess 121 is smaller than the thickness of the flexible substrate 10.

Specifically, the rigid substrate 100 is a glass substrate or a quartz substrate.

Furthermore, the protective layer 70 does not cover the recess 121 such that the bonding terminal 3 is exposed to bond the driving module 2.

In Step S3, a driving module 2 is provided, and the driving module 2 is bonded to the bonding terminal 3.

Specifically, the driving module 2 is a chip-on film (COF) or a flexible printed circuit (FPC).

As stated above, the present invention provides an OLED display device including an OLED display panel, a driving module and a bonding terminal. The OLED display panel includes a light-emitting surface and a non-light-emitting surface opposite to the light-emitting surface, the bonding terminal is disposed on the non-light-emitting surface, and the driving module is bonded to the bonding terminal. Since the bonding terminal is disposed on the non-light-emitting surface of the OLED display panel and the driving module is bonded to the bonding terminal on the non-light-emitting surface, compared with the prior art, the bonded driving module does not need to be bent again because the bonding terminal is disposed on the non-light-emitting surface of the OLED display panel. Accordingly, the reduction of the bezel width can be maximized and the screen ratio can be increased while reducing the risk of a broken wire. The present invention further provides a method for manufacturing an OLED display device capable of maximizing the reduction of the bezel width without the need for bending and increasing the screen ratio while reducing the risk of a broken wire.

In the above, for those with ordinary skill in the art, various other changes and modifications can be made according to the technical solutions and technical concept of the present invention, and all such changes and modifications are within the scope of the claims of the present invention.

What is claimed is:

1. An organic light-emitting diode (OLED) display device, comprising an OLED display panel, a driving module and a bonding terminal, wherein the OLED display panel comprises a light-emitting surface and a non-light-emitting surface opposite to the light-emitting surface, the bonding terminal is disposed on the non-light-emitting surface, and the driving module is bonded to the bonding terminal, wherein the OLED display panel comprises a flexible substrate, a driving circuit layer disposed on the flexible substrate, an OLED layer disposed on the driving circuit layer, and a thin-film encapsulation layer disposed on the OLED layer, wherein the OLED display panel is a bottom-emitting OLED display panel, the light-emitting surface thereof is a side surface of the flexible substrate away from the thin-film encapsulation layer, the non-light-emitting surface is a side surface of the thin-film encapsulation layer away from the flexible substrate, and the bonding terminal is electrically connected to the driving circuit layer through a first via hole penetrating the thin-film encapsulation layer and the OLED layer;

wherein an edge of the non-light-emitting surface of the OLED display panel is provided with a recess, in which the bonding terminal is disposed, wherein the recess is provided on a side of the thin-film encapsulation layer away from the flexible substrate, and a depth of the recess is smaller than a thickness of the thin-film encapsulation layer.

2. A method for manufacturing an OLED display device, comprising the steps of:

Step S1, manufacturing an OLED display panel comprising a light-emitting surface and a non-light-emitting surface opposite to the light-emitting surface; wherein Step S1 further comprises:

providing a rigid substrate, on which a flexible substrate is formed;

forming a driving circuit layer on the flexible substrate;

forming an OLED layer on the driving circuit layer; and forming a thin-film encapsulation layer on the OLED layer;

wherein the OLED display panel manufactured in Step S1 is a bottom-emitting OLED display panel, the light-emitting surface thereof is a side surface of the flexible substrate away from the thin-film encapsulation layer, and the non-light-emitting surface is a side surface of the thin-film encapsulation layer away from the flexible substrate;

Step S2, forming a bonding terminal on the non-light-emitting surface and providing an edge of the non-light-emitting surface of the OLED display panel with a recess, in which the bonding terminal is formed; wherein the recess is provided on a side of the thin-film encapsulation layer away from the flexible substrate, and a depth of the recess is smaller than a thickness of the thin-film encapsulation layer, and wherein Step S2 further comprises:

forming the bonding terminal on the side surface of the thin-film encapsulation layer away from the flexible substrate, wherein the bonding terminal is electrically connected to the driving circuit layer through a first via hole penetrating the thin-film encapsulation layer and the OLED layer; and lifting off the flexible substrate from the rigid substrate; and Step S3, providing a driving module, and bonding the driving module to the bonding terminal.

* * * * *